(12) United States Patent
Bunce et al.

(10) Patent No.: US 8,351,278 B2
(45) Date of Patent: Jan. 8, 2013

(54) JAM LATCH FOR LATCHING MEMORY ARRAY OUTPUT DATA

(75) Inventors: Paul A. Bunce, Poughkeepsie, NY (US); John D. Davis, Maybrook, NY (US); Diana M. Henderson, Poughkeepsie, NY (US); Jigar J. Vora, Westborough, MA (US)

(73) Assignee: International Business Machines Corporation, Armonk, NY (US)

( * ) Notice: Subject to any disclaimer, the term of this patent is extended or adjusted under 35 U.S.C. 154(b) by 266 days.

(21) Appl. No.: 12/822,038

(22) Filed: Jun. 23, 2010

(65) Prior Publication Data

US 2011/0317496 A1    Dec. 29, 2011

(51) Int. Cl.
*G11C 7/10* (2006.01)

(52) U.S. Cl. .................. 365/189.05; 365/203

(58) Field of Classification Search .......... 365/203, 365/189.05
See application file for complete search history.

(56) References Cited

U.S. PATENT DOCUMENTS

| | | | |
|---|---|---|---|
| 4,998,221 A | 3/1991 | Correale, Jr. | |
| 5,146,427 A | 9/1992 | Sasaki et al. | |
| 5,376,849 A | 12/1994 | Dickol et al. | |
| 5,450,357 A | 9/1995 | Coffman | |
| 5,612,916 A | 3/1997 | Neduva | |
| 5,623,217 A | 4/1997 | Britton et al. | |
| 5,726,677 A | 3/1998 | Imamura | |
| 5,818,409 A | 10/1998 | Furuhashi et al. | |
| 5,952,859 A | 9/1999 | Kim et al. | |
| 6,061,296 A | 5/2000 | Ternullo, Jr. et al. | |
| 6,084,454 A * | 7/2000 | Holst | 327/198 |
| 6,356,473 B1 | 3/2002 | Shimoyama | |
| 6,377,098 B1 | 4/2002 | Rebeor | |
| 6,384,754 B1 | 5/2002 | Park | |
| 6,510,089 B2 | 1/2003 | Taura et al. | |
| 7,042,262 B2 * | 5/2006 | Tam et al. | 327/199 |
| 7,075,855 B1 | 7/2006 | Bunce et al. | |
| 7,233,542 B2 | 6/2007 | Bunce et al. | |
| 7,246,279 B2 | 7/2007 | Pendurkar | |
| 7,363,526 B1 | 4/2008 | Chong et al. | |

(Continued)

FOREIGN PATENT DOCUMENTS

KR    100298181 B1    5/2001

(Continued)

OTHER PUBLICATIONS

IBM TDB Ristard CH; "Programmable Pulse Generator;" IP.COM Technical Disclosure; May 1, 1975.

(Continued)

*Primary Examiner* — Michael Tran
(74) *Attorney, Agent, or Firm* — Cantor Colburn LLP; William A. Kinnaman, Jr.

(57) ABSTRACT

A jam latch device for a data node includes a feed forward inverter having an input coupled to the data node; a feedback inverter having an input connected to an output of the feed forward inverter with an output of the feedback inverter connected to the data node; an isolation device that selectively decouples the feedback inverter from a power supply rail, the isolation device controlled by a clock signal of a reset device that resets the data node to a first logic state such that decoupling of the feedback inverter from the power supply rail coincides with resetting the data node to the first logic state; and a margin test device that selectively increases pull down strength of the feedback inverter.

17 Claims, 3 Drawing Sheets

U.S. PATENT DOCUMENTS

| | | |
|---|---|---|
| 7,425,855 B2 | 9/2008 | Chen et al. |
| 7,443,223 B2 | 10/2008 | Bajkowski et al. |
| 7,463,545 B2 | 12/2008 | Kumala |
| 7,515,482 B2 * | 4/2009 | Kim et al. ............... 365/189.05 |
| 7,535,776 B1 | 5/2009 | Behrends et al. |
| 7,596,053 B1 | 9/2009 | White et al. |
| 7,668,037 B2 | 2/2010 | Carpenter et al. |
| 7,710,796 B2 | 5/2010 | Cottier et al. |
| 2007/0002619 A1 * | 1/2007 | Schoenauer et al. ..... 365/185.08 |
| 2008/0029839 A1 | 2/2008 | Hold et al. |
| 2008/0258790 A1 | 10/2008 | Branch et al. |
| 2009/0059653 A1 | 3/2009 | Luk et al. |
| 2009/0109766 A1 | 4/2009 | Terzioglu et al. |
| 2010/0039872 A1 | 2/2010 | Park et al. |
| 2011/0317499 A1 | 12/2011 | Bunce et al. |
| 2011/0317505 A1 | 12/2011 | Bunce et al. |
| 2011/0320851 A1 | 12/2011 | Bunce et al. |

FOREIGN PATENT DOCUMENTS

| | | |
|---|---|---|
| WO | 0156084 A1 | 8/2001 |

OTHER PUBLICATIONS

J. Davis et al.; "A .6GHZ 64KB Dual-Read Data Cache for the Power6 Processor;" IEEE International Solid-State Circuits Conference; 2006.

IBM; "Level Shifter Incorporated into Address Pre-decode Circuit for SRAMs Employing 2 Voltage Planes;" IP.COM Technical Disclosure; Jan. 6, 2009.

Disclosed Anonymously; "A Clocked Single Supply Level Shifter with Buit-In Firewall;" IP.COM Technical Disclosure; Feb. 3, 2009.

U.S. Appl. No. 12/822,058; Non-Final Office Action; filed Jun. 23, 2010; Date Mailed: May 11, 2012; pp. 1-11.

U.S. Appl. No. 12/821,824; Non-Final Office Action; filed Jun. 23, 2010; Date Mailed: May 11, 2012; pp. 1-9.

* cited by examiner

US 8,351,278 B2

JAM LATCH FOR LATCHING MEMORY ARRAY OUTPUT DATA

BACKGROUND

The present invention relates generally to integrated circuit memory devices and, more particularly, to an improved jam latch for latching memory array output data.

As will be appreciated by those skilled in the art, in a domino Static Random Access Memory (SRAM), the individual cells do not employ sense amplifiers to sense the differential voltage on the bit line pairs coupled to the cross-coupled inverters that store the data. Rather, for a domino SRAM, the local bit line is precharged, discharged, and the discharge is detected. The local bit line, the means to precharge the local bit line, and the detector define a dynamic node of the domino SRAM.

A jam latch or keeper latch is used to capture data output from a memory array, such as in a domino SRAM. The jam latch temporarily holds the data so that a subsequent device or circuit can read the data. In this manner, the data may be accurately captured for a subsequent circuit stage to use the correct data level. More specifically, the jam latch performs a same cycle reset-then-set operation on the memory array output node.

In a p-domino type circuit topology, the output node is precharged to a logic low or "0" state, in which a single NFET (n-type field effect transistor) device is used to reset the latch against (1) the latch's own feedback and (2) late arriving dynamic data that is still active from a previous cycle. Where data to be read from the array (or write data to be presented at the output) is a logic high or "1" state, a PFET (p-type field effect transistor device pulls the output node up to the logic "1" state where it is held by the jam latch prior to the next reset operation. However, such reset/set fight creates a potential power burn collision in the latch, making it more difficult for a reset to occur.

SUMMARY

In an exemplary embodiment, a jam latch device for a data node includes a feed forward inverter having an input coupled to the data node; a feedback inverter having an input connected to an output of the feed forward inverter with an output of the feedback inverter connected to the data node; and an isolation device that selectively decouples the feedback inverter from a power supply rail, the isolation device controlled by a clock signal of a reset device that resets the data node to a first logic state such that decoupling of the feedback inverter from the power supply rail coincides with resetting the data node to the first logic state; wherein the data node comprises an output node of a memory array.

In another embodiment, an output control circuit for a memory array, includes a data output node that is precharged to a first logic state prior to a read operation and prior to a write operation of the memory array; logic configured to selectively couple memory cell data to the data output node during a memory evaluate operation; and a jam latch device for latching memory cell data on the data output node, the jam latch device further including a feed forward inverter having an input coupled to the data output node; a feedback inverter having an input connected to an output of the feed forward inverter with an output of the feedback inverter connected to the data output node; and an isolation device that selectively decouples the feedback inverter from a first power supply rail, the isolation device controlled by a clock signal of a reset device that resets the data output node to a first logic state prior to the memory evaluate operation such that decoupling of the feedback inverter from the first power supply rail coincides with resetting the data output node to the first logic state.

In another embodiment, a method of latching a data output node includes coupling an input of a feed forward inverter the data node; coupling an output of the feed forward inverter to an input of a feedback inverter, with an output of the feedback inverter connected to the data node; and selectively decoupling, with an isolation device, the feedback inverter from a first power supply rail, the isolation device controlled by a clock signal of a reset device that resets the data node to a first logic state such that decoupling of the feedback inverter from the first power supply rail coincides with resetting the data node to the first logic state.

BRIEF DESCRIPTION OF THE SEVERAL VIEWS OF THE DRAWINGS

Referring to the exemplary drawings wherein like elements are numbered alike.

DETAILED DESCRIPTION

Disclosed herein is an improved jam latch for latching memory array output data. The embodiments herein represent an area-efficient solution to improving the resetability of the jam latch by adding a restore gated PFET in series with the feedback stack of the latch. The PFET is controlled by the reset clock associated with the array output node such that when the reset clock goes active high, it isolates the feedback portion of the jam latch driving the set value, and as a result the reset clock pulse does not have to fight against this action during a restore operation. Such an approach minimizes area impact by the addition of just a single device.

Figure 1:
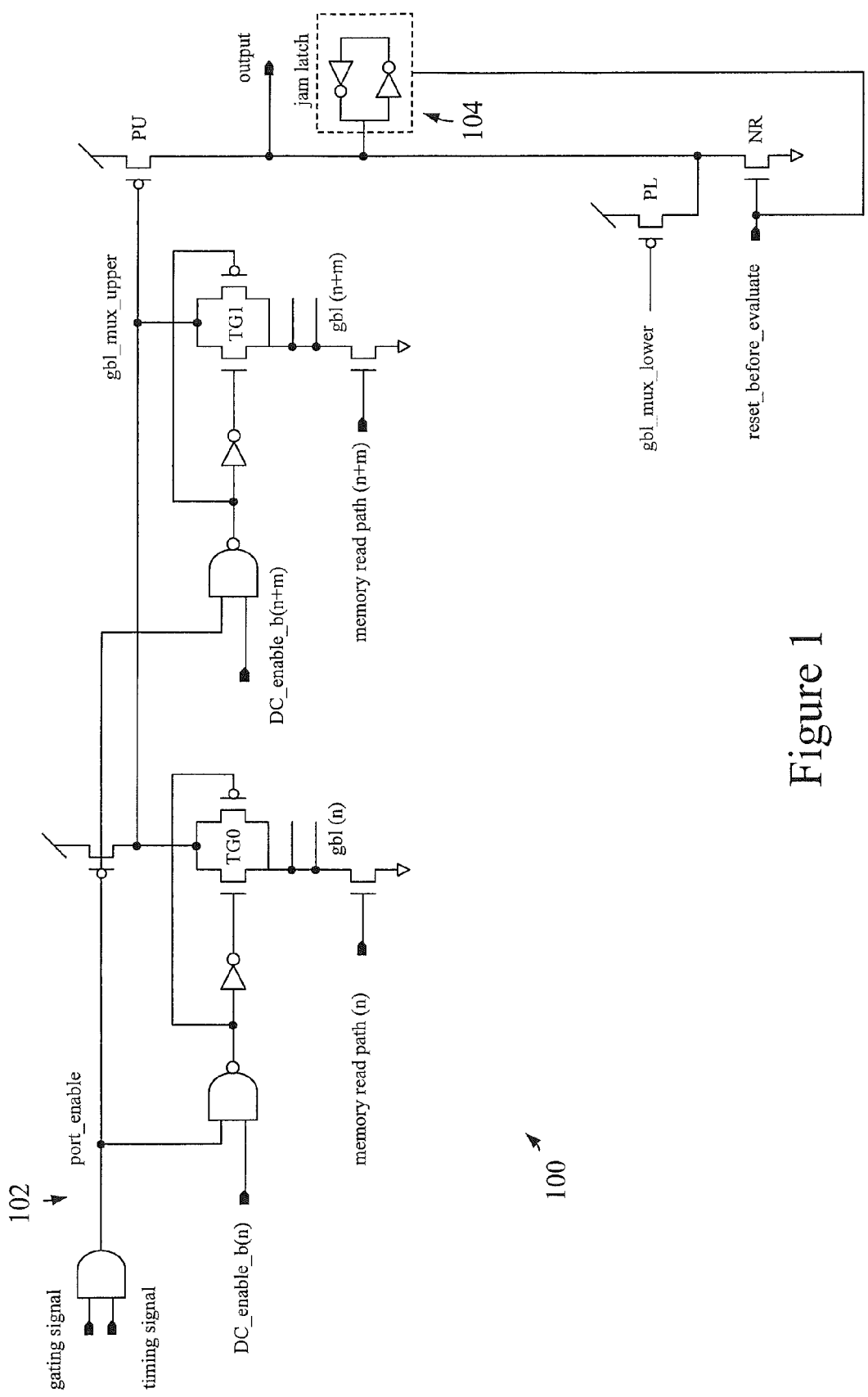
FIG. 1 is a schematic diagram of a memory array output control circuit suitable for use in accordance with an embodiment of the invention.

Referring initially to FIG. 1, there is shown a schematic diagram of a memory array output control circuit 100 for an SRAM array, suitable for use in accordance with an embodiment of the invention. For purposes of simplicity, gating and multiplexing functions are shown for an upper portion of the SRAM array only, but it will be understood that similar circuitry is also used to perform the same functions for a lower portion of the SRAM array. As will also be appreciated, the specific gating devices (e.g., AND, NAND, etc.) shown in the figure are exemplary and could be replaced by other logically equivalent circuits.

As is shown in FIG. 1, the control circuit includes a timing/gating function, generally depicted at 102, as well as a multiplexing function depicted by transmission gate pairs TG0 and TG1, which are parallel configured n-type field effect transistor (NFET) and p-type field effect transistor (PFET) devices. The multiplexing is used to select between a nominal memory read data path, memory read path (n), and a redundant memory read data path, memory read path (n+m). For illustrative purposes, only a single global bit line gbl(n) and a single redundant global bit line gbl(n+m) are shown, although it will be appreciated that several such bit lines (e.g., 16, 32) may be present for each portion of the array.

The signal gbl_mux_upper, representing the multiplexed memory read path output is coupled to a pull up PFET PU, which determines whether the latched output node "output" is charged up from a "reset 0" state. Also, for illustrative purposes, a corresponding pull up PFET PL (controlled by the signal gbl_mux_lower) is shown for the lower portion of the SRAM array. The signal gbl_mux_lower is generated in a similar manner with respect to signal gbl_mux_upper.

In a standby state of operation, the control signals "gating signal" and "timing signal" that are inputs to AND gate 102 are at logic low, or inactive. As a result, neither the nominal memory read data path (memory read path (n)), nor the redundant memory read data path, (memory read path (n+m)) affect the output node, which is at a previous state held by a jam latch 104. The specific operation of the jam latch 104 will be described in further detail hereinafter.

The inputs DC_enable_b(n) and DC_enable_b(n+m) are configured to allow only one of the two transmission gates (TG0 or TG1) to be on at a given time, in accordance with a memory redundancy scheme. During a normal read access, the reset_before_evaluate signal will temporarily pulse high, causing the pull down NFET NR and set the jam latch 104 and the output signal to a low state. Subsequently, both the timing signal (upper or lower) and the gating signal (i.e., read enable) will go active high, allowing the state of the selected memory read path (n or n+m) to be coupled to the jam latch 104 and the output. In the case where the selected memory read path contains a logic low value, the associated pull up PFET (PU or PL) remains deactivated, and thus does not disturb the latched "0" state of the output. Conversely, where the selected path contains a logic high value, the associated pull up PFET (PU or PL) is activated, causing the state of the jam latch 104 and output to change from "0" to "1." The control signals "gating signal" and "timing signal" are such that only one of the pull up PFETs, PU or PL, is active for any given access of the memory array.

In this configuration, it will be noted that for the latter case that the time when the output changes state is determined by three separate signals, namely reset_before_evaluate, timing signal, and memory read path. The reset_before_evaluate signal determines when the output transitions to a preset low state. The timing signal has less timing variation than the memory read path signal and is designed to go active sooner than the slowest memory read path and later than the fastest memory read path.

Because the gating signal is also used for a write mode of operation, the port enable signal allows a multiplexed memory read path to be coupled to the output during a write. Thus, for the above described fast write scenario, if a "0" were to be written to the memory cell, but the memory cell contains a "1", then this "1" could undesirably appear on the output prior to completion of the write.

Figure 2:
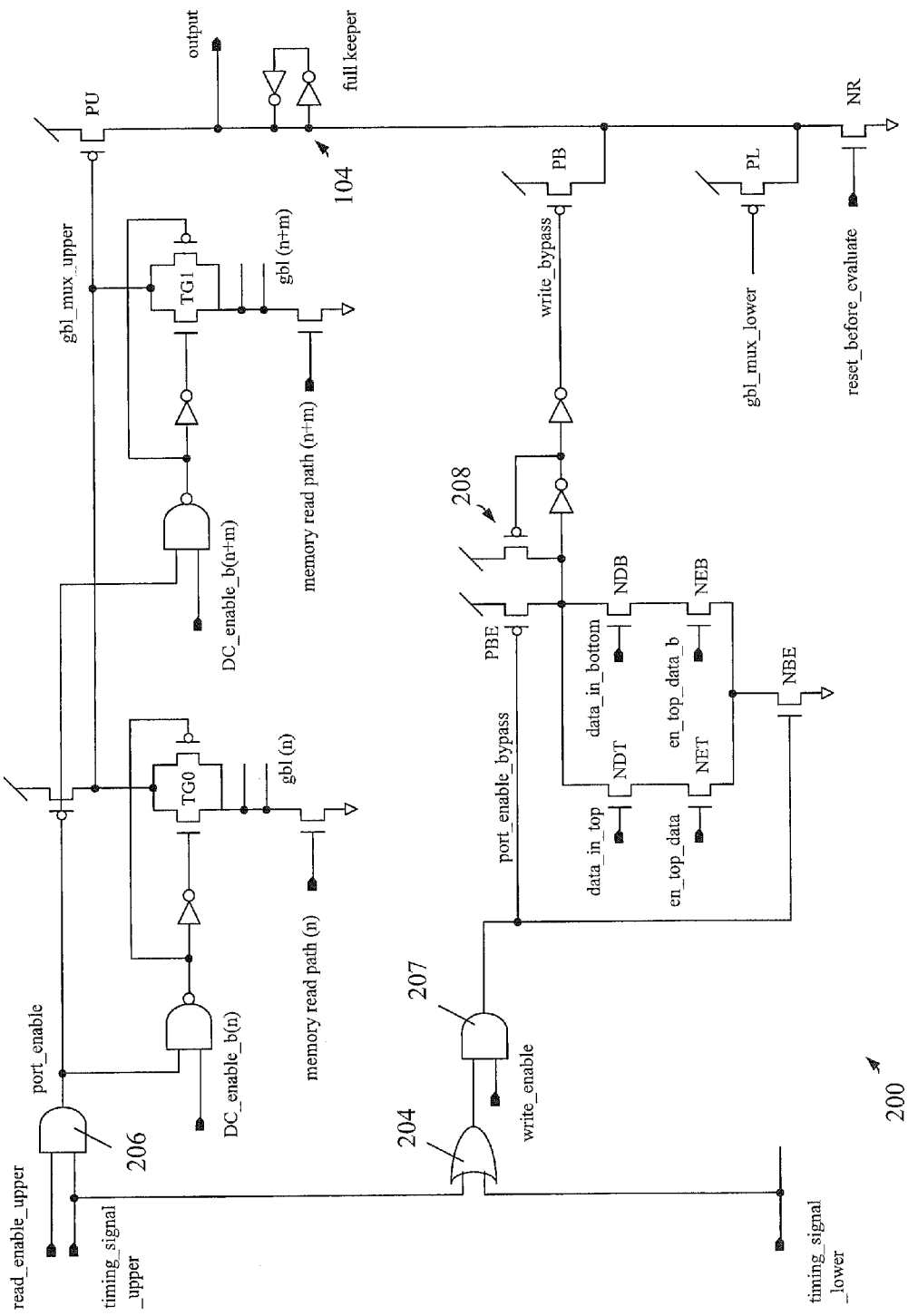
FIG. 2 is a schematic diagram of another memory array output control circuit suitable for use in accordance with an embodiment of the invention.

FIG. 2 is a schematic diagram of another memory array output timing control circuit 200, also suitable for use in accordance with an embodiment of the invention. Here, a third port is effectively added to the control circuitry such that the memory read paths are completely decoupled from the output during a write mode. Instead, write data is internally directed to the output node.

For purposes of simplicity, like components with respect to FIG. 1 have the same reference designations in FIG. 2. In more detail, the control circuit 200 further provides logic gating, including OR gate 204 and AND gate 206. In contrast to FIG. 1, the control circuit 200 of FIG. 2 separates the read enable and write enable control signals. The timing signals (from both the upper and lower portions of the SRAM), however, are also used by the bypass circuitry, with the upper and lower timing signals (timing_signal_upper, timing_signal_lower) being input to the OR gate 204, the output of which is coupled to the AND gate 206. The other input to the AND gate 206 is the separate write_enable control signal.

As further shown in FIG. 2, another pull up PFET (PB) is coupled to the output node and keeper latch 104. Since the bypass circuitry services both upper and lower portions of the array, a network of pull down NFETs (NDT, NDB, NET, NEB and NBE) is used to couple write data from either the top or bottom portion of the array to the output node and keeper latch 104. NFET NBE acts as a footer device for the NFET stacks NDT/NET and NDB/NEB, with NBE activated by the output of AND gate 207, which outputs a port_enable_bypass signal. This signal also controls a header PFET PBE to maintain PB in a deactivated state when port_enable_bypass signal is low. A half latch 208 (keeper PFET) will also initially maintain the state of the input signal to PB once port_enable_bypass goes active.

In the case of a read operation, the write enable signal is held low, which thereby deactivates the port_enable_bypass signal and thus PB is held off. All of the remaining devices of the circuit 200 behave as described above. In the case of a write operation, the read_enable_upper signal and corresponding read_enable_lower signal (not shown) would remain low (inactive), thus preventing memory read paths from activating PU or PL. Instead, the write_enable signal goes high (active). As is the case with a read operation, the reset_before_evaluate signal still pulses high to set the keeper latch 104 and output node to a low state. Furthermore, during a write operation, instead of the state of a memory read path being transferred to the keeper latch 104 and output node, a logical derivative of the write data into the array is transferred. In the embodiment of FIG. 2, the transferred data would be either the "data in" being written to the top half of the array (data_in_top) or to the bottom half of the array (data_in_bottom), depending on the state of the en_top_data/en_top_data_b control signal pair.

It should be appreciated that the NFET devices NDT, NDB, NET, and NEB may be replaced by any given pulldown structure and can implement many different functions. So long as the control circuit 200 makes use of the reset_before_evaluate signal and makes use of the timing signal to generate the port_enable_bypass signal, output transitions within the same timeframe as read operations from the memory read path may be generated.

Figure 3:
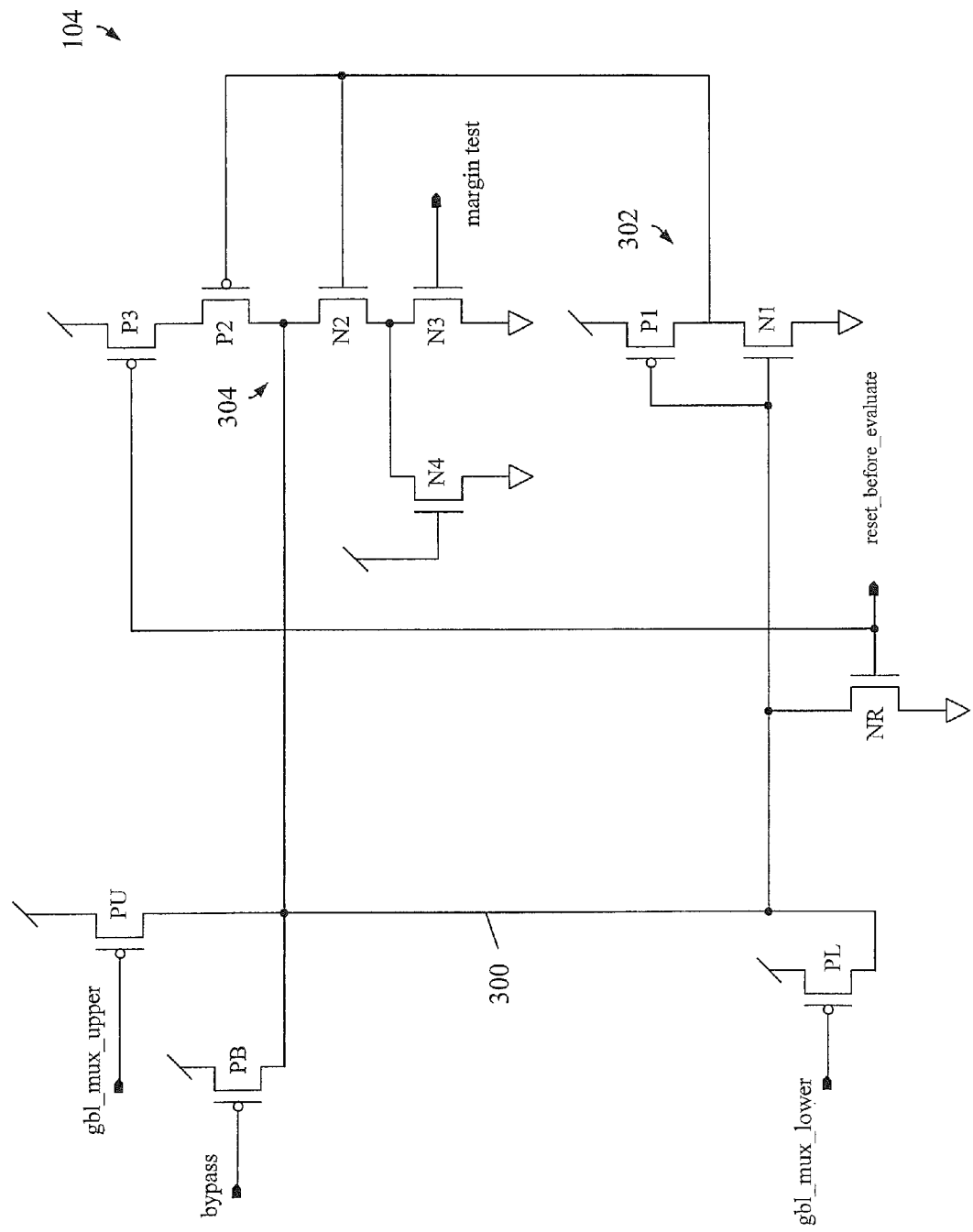
FIG. 3 is a schematic diagram of a jam latch for a memory array output control circuit, in accordance with an embodiment of the invention.

Referring now to FIG. 3, the details of the jam latch 104 are illustrated in further detail. The jam latch 104 is coupled to a memory array output node 300 as depicted in either FIG. 1 or FIG. 2. In the specific example illustrated, the output node 300 has pull up PFETs PU and PL, as well as the write bypass PFET PB connected thereto, as in the description of FIG. 2. As is further shown in FIG. 3, the latch 104 includes a feed forward inverter 302 formed by PFET P1 and NFET N1, the inputs of which are connected to the output node 300. The output of the feed forward inverter 302 is coupled to the input of a feedback inverter 304, which includes PFET P2 and NFET N2. In addition, a gated header PFET P3 is configured between PFET P2 and a logic high (e.g., Vdd) power supply rail, with the gate of the header PFET P3 controlled by the same clock reset signal (reset_before_evaluate) used to operate the output node reset NFET NR.

The jam latch 104 may optionally include a test margin switch, NFET N3 in parallel with always (fully) on NFET N4, where N3 and N4 are placed in series between the feedback inverter NFET N2 and a logic low (e.g., ground) power supply rail. When activated, the normally off NFET N3 margin switch tests the setability of the jam latch by increasing the pulldown strength of the feedback inverter 304, in effect mimicking a stronger restore state. This would represent an additional pulldown strength that a set operation (i.e., one of gbl_mux_upper, gbl_mux_lower, or bypass=0) would have to overcome. If a set operation can still pull up the output node 300 against the additional latch pulldown strength, then this is an indication that under normal operating circumstances (N3 is off), the latch can sufficiently be set.

Logically, the jam latch 104 is of a slave or "L2" latch configuration, and thus a traditional L2 latch could be considered for this function. However, for optimal tracking (timing) with the array data arriving at latch, the jam latch 104 uses a clock signal derived off the clock that launches the array access. From a performance perspective, a traditional L2 is also not optimal as it would require its input to travel through the latch (and feedback) before being output, which adds stages of delay to the critical path. This is unlike a conventional jam latch where the latched output node simply has a full keeper "hanging" off the node. Also, in order to achieve the reset-then-set function, the jam latch 104 uses a narrow resetting pulsed clock, which provides ample evaluate time for either read or write bypass data to set the latch 104. The use of a conventional L2 latch would result in the additional overhead of another local clock buffer to generate the L2's clock signal, adding timing complexity and increasing the overall area usage in macro implementation.

An exemplary operation of the jam latch 104 in conjunction with a memory array output circuit is as follows:

Initially, the jam latch 104 holds the memory array data on each read cycle. The reset_before_evaluate signal is a pulsed domino clock signal that always returns to 0 at least once during the cycle, and is derived off the leading edge of a chip's mesh clock. During this clock pulse, the PFET header P3 is shut off, which temporarily incapacitates the pull up portion of the feedback inverter 304. In the event the previous data on the output node 300 were "1" then the pull up PFET P2 of the feedback inverter 304 is prevented from opposing the discharge of the output node 300 to "0" caused by the pulsed active NFET NR. In other words, a narrow clock pulse is sufficient to ensure quick resetting of the output node 300 so as to avoid a collision with any incoming "1" data by virtue of any of the output node pull up devices (e.g., PU, PL, PB) going active low.

Conceptually, the gated feedback technique could also be applied to the feedback inverter 304 for the set path (i.e., where "1" data is asserted on the output as a result of a low signal on one of the pull up devices PU, PL, PB charging up the output node 300) by using gated NFET footers. However, as opposed to a single pull down NFET for the reset operation, there are multiple PFET devices that can pull up the output node 300 during an evaluation. Thus, in the example depicted, there would have to be three series NFETs connected between N3 and ground (one for each of PU, PL and PB) to apply this technique for the set path. Because this would add to both the circuit complexity and the load on each mux signal, gated feedback for the reset path represents an advantageous compromise between gated set and reset paths, versus a pure, non-gated jam latch Once the output node 300 is reset, one of the three array output signals (e.g., gbl_mux_upper, gbl_mux_lower, or bypass) may go low during an evaluation period, depending on the data value of the array cell read contents or the write data to the array cell. Any such signal would pull the output node from a precharged logic "0" value to a logic "1" value. More specifically, during such an evaluation, the keeper PFET P3 is on, meaning that both of the jam latch inverters 302, 304 are fully operational. As the output node 300 is pulled up, the output of the feed forward inverter 302 transitions from high to low, which allows P2 to reinforce the logical "1" on the output node.

Again, during a subsequent cycle, given a logical "1" on the output node from a previous cycle, the reset_before_evaluate clock signal (though NFET NR) will reset the output node 300 to logical "0" in opposition to the latch "1" value. However, since the pulsed high reset_before_evaluate clock signal simultaneously deactivates the PFET header P3, feedback of the set "1" value by the feedback inverter 304 is interrupted such that it does not oppose the pull down action of NR. In previous designs, where this PFET header is not present, the feedback portion of the jam latch 104 temporarily opposes such a reset action, and as a result, a longer reset_before_evaluate pulse was needed in order to ensure completion of the reset operation.

Finally, it should be appreciated that while the exemplary embodiments depict a p-domino type circuit topology, the jam latch 104 may also be implemented using an n-domino topology. For example, where an output node is precharged to a logic high value by a pull up PFET and set to a logic low value by array output NFET devices, then an active low reset_before_evaluate clock signal could be coupled to an NFET footer in the feedback inverter to eliminate opposition to a reset high operation. In this sense, either a header PFET or a footer NFET may generally be referred to as an isolation device for the feedback inverter portion of the jam latch. Regardless of the polarity of the circuit topology, the embodiments herein provide flexibility in allowing shaping of the timing of the reset_before_evaluate clock signal, and the ability to avoid a powerburn scenario between the reset_before_evaluate clock signal and evaluate signals.

At each technology node scaling, this path becomes more of an issue by having to meet more aggressive cycle time targets, with the jam latch having to perform three separate functions within the given cycle time, namely: (1) launch the current cycle's data out to a downstream capturing latch; (2) restoring the latch; and (3) shutting off the restore clock signal in time so that the latch may be updated by one of the parallel PFETs of the latched output node pulling it up. Without a restore-gated header PFET enabled narrow restore clock pulse, such as described above, it would be more difficult to avoid a reset clock/array data collision, thus impacting both timing and power.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A jam latch device for a data node, comprising:
a feed forward inverter having an input coupled to the data node;
a feedback inverter having an input connected to an output of the feed forward inverter with an output of the feedback inverter connected to the data node; and
an isolation device that selectively decouples the feedback inverter from a first power supply rail, the isolation device controlled by a clock signal of a reset device that resets the data node to a first logic state such that decoupling of the feedback inverter from the first power supply rail coincides with resetting the data node to the first logic state;

wherein the data node comprises an output node of a memory array, and wherein the reset device comprises a first n-type field effect transistor (NFET) that resets the data output node to a logic low state.

2. The device of claim 1, wherein the isolation device comprises a p-type field effect transistor (PFET) header connected between the first power supply rail and the feedback inverter.

3. The device of claim 1, further comprising a margin test device that selectively increases pull down strength of the feedback inverter.

4. The device of claim 3, wherein the margin test device comprises a second NFET connected between the feedback inverter and a second power supply rail.

5. The device of claim 4, further comprising a fully-on connected NFET in parallel with the second NFET.

6. An output control circuit for a memory array, comprising:
 a data output node that is precharged to a first logic state prior to a read operation and prior to a write operation of the memory array;
 logic configured to selectively couple memory cell data to the data output node during a memory evaluate operation; and
 a jam latch device for latching memory cell data on the data output node, the jam latch device further comprising:
  a feed forward inverter having an input coupled to the data output node;
  a feedback inverter having an input connected to an output of the feed forward inverter with an output of the feedback inverter connected to the data output node; and
  an isolation device that selectively decouples the feedback inverter from a first power supply rail, the isolation device controlled by a clock signal of a reset device that resets the data output node to a first logic state prior to the memory evaluate operation such that decoupling of the feedback inverter from the first power supply rail coincides with resetting the data output node to the first logic state.

7. The circuit of claim 6, wherein the isolation device comprises a p-type field effect transistor (PFET) header connected between the first power supply rail and the feedback inverter.

8. The circuit of claim 7, wherein the reset device comprises a first n-type field effect transistor (NFET) that resets the data output node to a logic low state.

9. The circuit of claim 8, further comprising a margin test device that selectively increases pull down strength of the feedback inverter.

10. The circuit of claim 9, wherein the margin test device comprises a second NFET connected between the feedback inverter and a second power supply rail.

11. The circuit of claim 10, further comprising a fully-on connected NFET in parallel with the second NFET.

12. A method of latching a data output node, the method comprising:
 coupling an input of a feed forward inverter to the data node;
 coupling an output of the feed forward inverter to an input of a feedback inverter, with an output of the feedback inverter connected to the data node; and
 selectively decoupling, with an isolation device, the feedback inverter from a first power supply rail, the isolation device controlled by a clock signal of a reset device that resets the data node to a first logic state such that decoupling of the feedback inverter from the first power supply rail coincides with resetting the data node to the first logic state, wherein the reset device comprises a first n-type field effect transistor (NFET) that resets the data output node to a logic low state.

13. The method of claim 12, wherein the isolation device comprises a p-type field effect transistor (PFET) header connected between the first power supply rail and the feedback inverter.

14. The method of claim 12, further comprising configuring a margin test device that selectively increases pull down strength of the feedback inverter.

15. The method of claim 14, wherein the margin test device comprises a second NFET connected between the feedback inverter and a second power supply rail.

16. The method of claim 15, further comprising configuring a fully-on connected NFET in parallel with the second NFET.

17. The method of claim 12, wherein the data node comprises an output node of a memory array.

* * * * *